US012721089B2

(12) United States Patent
Ishikawa et al.

(10) Patent No.: US 12,721,089 B2
(45) Date of Patent: Aug. 25, 2026

(54) MULTI-ZONE LAMP HEATING FOR CHEMICAL VAPOR DEPOSITION

(71) Applicant: Applied Materials, Inc., Santa Clara, CA (US)

(72) Inventors: Tetsuya Ishikawa, San Jose, CA (US); Ala Moradian, San Jose, CA (US); Manjunath Subbanna, Bangalore (IN); Kim Vellore, San Jose, CA (US); Matthew Miller, Newark, CA (US); Michael Rice, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 848 days.

(21) Appl. No.: 17/733,685

(22) Filed: Apr. 29, 2022

(65) Prior Publication Data

US 2023/0352322 A1 Nov. 2, 2023

(51) Int. Cl.

*C23C 16/46* (2006.01)
*C23C 16/458* (2006.01)
*H10P 72/00* (2026.01)
*C23C 16/48* (2006.01)
*H05B 3/00* (2006.01)

(52) U.S. Cl.

CPC ...... *H10P 72/0436* (2026.01); *C23C 16/4586* (2013.01); *C23C 16/46* (2013.01); *C23C 16/482* (2013.01); *H05B 3/0047* (2013.01)

(58) Field of Classification Search

CPC ........... H01L 21/67115; C23C 16/4586; C23C 16/46; C23C 16/4584; C23C 16/52; C23C 16/482; H05B 3/0047

See application file for complete search history.

(56) References Cited

U.S. PATENT DOCUMENTS 5,446,825 A 8/1995 Moslehi et al.
5,930,456 A * 7/1999 Vosen .................... C30B 31/12 392/416
6,108,491 A * 8/2000 Anderson ........... H10P 72/0436 392/416
6,122,440 A * 9/2000 Campbell ........... H10P 72/0436 392/420

(Continued)

FOREIGN PATENT DOCUMENTS

JP H09237763 A 9/1997
KR 10-2012-0054636 A 5/2012

(Continued)

OTHER PUBLICATIONS

International Preliminary Report on Patentability from PCT Application No. PCT/US2023/016717, dated Nov. 7, 2024, 6 pages.

(Continued)

*Primary Examiner* — Aiden Lee

(74) *Attorney, Agent, or Firm* — Schwabe, Williamson & Wyatt, P.C.

(57) ABSTRACT

Embodiments disclosed herein include a lamp module for a semiconductor processing chamber. In an embodiment, the lamp module plate comprises a back plate, a first ring that extends from the back plate, a second ring that extends from the back plate, and a third ring that extends from the back plate. In an embodiment, the lamp module further comprises a first plurality of lamps between the first ring and the second ring, a second plurality of lamps between the second ring and the third ring, and a third plurality of lamps configured to emit infrared radiation that propagates into the third ring.

17 Claims, 9 Drawing Sheets

(56) References Cited

U.S. PATENT DOCUMENTS

| | | | | |
|---|---|---|---|---|
| 6,476,362 | B1 * | 11/2002 | Deacon | H10P 72/0436 118/724 |
| 2004/0125593 | A1 * | 7/2004 | Nam | H05B 3/0047 362/92 |
| 2010/0018960 | A1 | 1/2010 | Gat et al. | |
| 2011/0021549 | A1 | 1/2011 | Gharat et al. | |
| 2011/0052159 | A1 * | 3/2011 | Su | H10P 72/0436 392/416 |
| 2011/0121503 | A1 | 5/2011 | Burrows et al. | |
| 2012/0145697 | A1 * | 6/2012 | Komatsu | H01L 21/68792 219/438 |
| 2013/0284095 | A1 | 10/2013 | Ranish | |
| 2016/0227606 | A1 * | 8/2016 | Samir | H05B 3/0047 |
| 2016/0289835 | A1 | 10/2016 | Kuh et al. | |
| 2019/0127851 | A1 * | 5/2019 | Lau | B23K 26/0006 |
| 2021/0285105 | A1 | 9/2021 | Lau et al. | |

FOREIGN PATENT DOCUMENTS

| | | | |
|---|---|---|---|
| TW | 201128708 | A | 8/2011 |
| TW | 201128734 | A | 8/2011 |
| TW | 201639037 | A | 11/2016 |
| TW | 201931493 | A | 8/2019 |
| WO | 2011021549 | A1 | 2/2011 |
| WO | 2022060510 | A1 | 3/2022 |

OTHER PUBLICATIONS

International Search Report and Written Opinion from PCT/US2023/016717 dated Jul. 25, 2023, 10 pgs.

Official Letter from Taiwan Patent Application No. 112114024 dated Aug. 6, 2025, 9 pgs.

Official Letter from Taiwan Patent Application No. 112114024 dated Feb. 10, 2026, 12 pgs.

Notice of Preliminary Rejection from Korean Patent Application No. 10-2024-7039288 dated Mar. 18, 2026, 12 pgs.

Notice of Reasons for Rejection from Japanese Patent Application No. 2024-563906 dated Nov. 4, 2025, 6 pgs.

Extended European Search Report from European Patent Application No. 23796998.5 dated Apr. 23, 2026, 8 pgs.

* cited by examiner 350
360
330A
317
310
361
353
355
357
352
330A
351

MULTI-ZONE LAMP HEATING FOR CHEMICAL VAPOR DEPOSITION

BACKGROUND

1) Field

Embodiments relate to the field of semiconductor manufacturing and, in particular, chemical vapor deposition chambers with at least three heating zones.

2) Description of Related Art

In semiconductor manufacturing processes, the control of substrate temperature is critical in order to provide necessary uniformity of the process across the substrate. For example, careful control of wafer temperature may be necessary in order to provide high process uniformity in a chemical vapor deposition (CVD) process. Typically, the substrate is heated through the use of heating lamps. The lamps irradiate the substrate through an enclosure. That is, the heaters are outside of the chamber. In order to allow the thermal energy to pass through the enclosure, the enclosure is a material that is transparent to infrared radiation. For example, the enclosure may comprise quartz or the like. Similarly, lamps and a enclosure may also be provided on a backside surface of the chamber in order to heat the backside surface of the substrate. The substrate may be rotated in order to provide improved temperature uniformity.

In existing CVD tools, reflectors are used to focus the infrared radiation towards the surface of the substrate. In some instances, the reflector may include a first zone and a second zone. The first zone is focused on an outer region of the substrate, and the second zone is focused on a central region of the substrate. While two zones are beneficial to a certain extent, it may be desirable to provided even finer control of the substrate temperature than is possible with a two zone reflector.

SUMMARY

Embodiments disclosed herein include a lamp module for a semiconductor processing chamber. In an embodiment, the lamp module comprises a back plate, a first ring that extends from the back plate, a second ring that extends from the back plate, and a third ring that extends from the back plate. In an embodiment, the lamp module further comprises a first plurality of lamps between the first ring and the second ring, a second plurality of lamps between the second ring and the third ring, and a third plurality of lamps configured to emit infrared radiation that propagates into the third ring.

Embodiments disclosed herein further comprise semiconductor processing tool. In an embodiment, the semiconductor processing tool comprises a pedestal for supporting a substrate, a first enclosure over the pedestal, a second enclosure below the pedestal, and a first lamp module over the first enclosure, where the first lamp module comprises three or more heating zones, a second lamp module under the second enclosure, where the second lamp module comprises a plurality of heating zones.

Embodiments may further comprise a semiconductor processing tool. In an embodiment, the semiconductor processing tool comprises a pedestal for supporting a substrate, a first enclosure over the pedestal, a second enclosure below the pedestal, and a first lamp module over the first enclosure. In an embodiment, the first lamp module comprises a back plate, a first ring that extends from the back plate, a second ring that extends from the back plate, a third ring that extends from the back plate, a first plurality of lamps between the first ring and the second ring, a second plurality of lamps between the second ring and the third ring, and a third plurality of lamps configured to emit infrared radiation that propagates into the third ring. In an embodiment, the semiconductor processing tool further comprises a second lamp module under the second enclosure, where the second lamp module comprises a plurality of heating zones.

DETAILED DESCRIPTION

Systems described herein include chemical vapor deposition chambers with at least three heating zones. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, current lamp module architectures for semiconductor manufacturing tools are generally limited to two lamp zones. While two lamp zones provide some degree of control on temperature uniformity, it is desirable to provide even greater control of substrate temperature. Accordingly, embodiments disclosed herein include semiconductor manufacturing tools that include three or more lamp zones. For example, a lamp module may be used that focuses the infrared light from a plurality of lamps onto three regions of the underlying substrate. For example, infrared light may be focused on an edge region, a middle region, and a center region of the substrate. To provide even greater temperature uniformity, the substrate may be on a susceptor that is rotatable.

In other embodiments, multi-zone lamp modules may also be provided on a backside of the substrate. In some embodiments, the backside reflector may focus the infrared light at the interfaces between the zones of the front-side lamp module. For example, a backside zone may be focused at the interface between the first zone and the second zone of the front-side lamp module. In such embodiments, improved thermal uniformity across the surface of the substrate may be provided.

In an embodiment, the multi-zone lamp module may comprise a plurality of rings that extend up from a base plate. As used herein "extend up", "extends up", "extend from" or "extends from" may refer to a first structural body that has a plane that intersects a plane of a second structural body. In some instances, the planes may be substantially orthogonal to each other, though the two planes need not be orthogonal in all instances. A first ring may be an outer ring. A second ring may be within the first ring, and a third ring may be within the second ring. Lamps may be provided between the rings. The rings and the back plate may be configured to focus the thermal energy from the lamps onto a particular region of the substrate (e.g., an outer region, a middle region, and a center region).

Figure 1A:
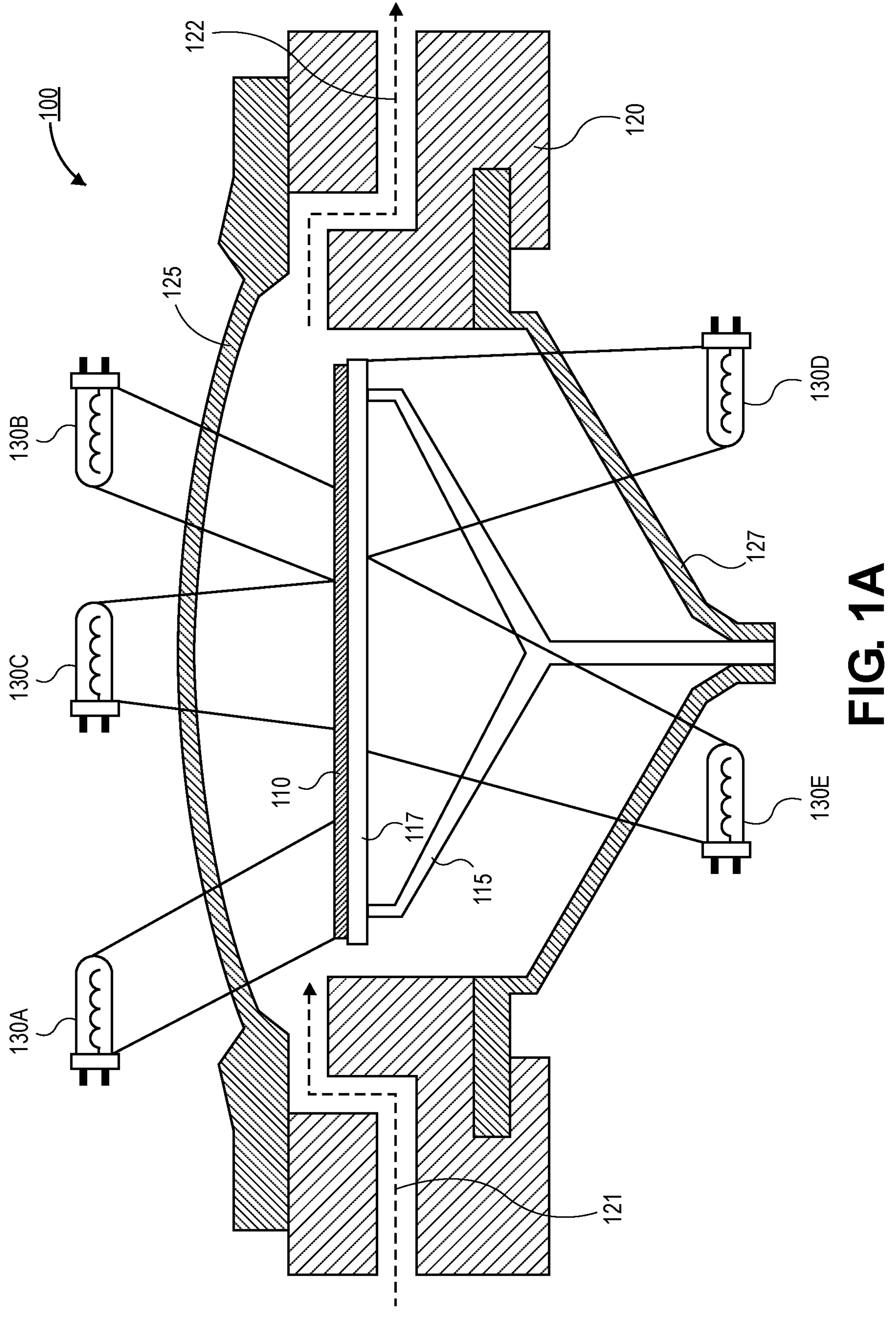
FIG. 1A is a cross-sectional illustration of a semiconductor processing tool with top lamps that include three zones, in accordance with an embodiment.

Referring now to FIG. 1, a cross-sectional illustration of a semiconductor manufacturing tool 100 is shown, in accordance with an embodiment. In an embodiment, the semiconductor manufacturing tool 100 (tool 100 for short) may comprise any type of semiconductor manufacturing tool that may require precise substrate temperature control. In one embodiment, the tool 100 may be a chemical vapor deposition (CVD) tool. Other tools 100 that may be used are atomic layer deposition (ALD) tools, rapid thermal processing (RTP) tools, or the like. In the illustrated embodiment, tools 100 without plasma capability are shown. However, it is to be appreciated that tools 100 may also comprise the capability to use a plasma in order to implement various processing regimes.

In an embodiment, the tool 100 may comprise a chamber body 120. The chamber body 120 may include any suitable material, such as stainless steel, or the like. In an embodiment, a coating (not shown) may be provided over an interior surface of the chamber body 120. For example, the coating may be a chamber seasoning or protection layer. In an embodiment, gas 121 may enter the tool 100 through a first portion of the chamber body 120, and gas 122 may exit the tool through a second portion of the chamber body 120. While the gas 121 and 122 are shown entering and exiting through the chamber body 120, it is to be appreciated that the gas may enter or exit the chamber through any portion of the tool 100, depending on the type of tool 100 that is being used.

In an embodiment, a substrate support 115 and a susceptor 117 are provided in the tool 100. The substrate support 115 and the susceptor 117 are configured to hold and/or secure a substrate 110. For example, the substrate 110 may be a semiconductor substrate, such as a silicon wafer. The substrate 110 may have any suitable form factor. For example, a diameter of the substrate 110 may be 300 mm, 450 mm, or any standard wafer form factor. Additionally, other substrates 110 may be used in the tool 100. For example, glass substrates, ceramic substrates, or the like may also be used in some embodiments. In an embodiment, the substrate support 115 and the susceptor 117 may be configured to rotate. The rotation allows for improved temperature uniformity across the substrate 110.

The susceptor 117 may include any type of chucking architecture in order to secure the substrate 110. In some embodiments, the susceptor 117 may include an electrostatic chucking (ESC) architecture. In such an embodiment, the substrate 110 is secured to the susceptor 117 by an electrostatic force. Other embodiments may include a vacuum chucking architecture for the susceptor 117. In an embodiment, the susceptor 117 and the substrate support 115 may comprise a quartz material or another material that is at least substantially transparent to infrared radiation. As such, the backside surface of the substrate 110 can also be heated in some embodiments.

In an embodiment, the tool 100 may include a top enclosure 125. The top enclosure 125 may sometimes be referred to as a lid or a chamber lid. The top enclosure 125 may be formed from a material that is at least substantially transparent to infrared radiation. For example, the top enclosure 125 may comprise quartz or the like. In the illustrated embodiment, the top enclosure 125 has a curved surface and is domed shaped. In other embodiments, the top enclosure 125 may be substantially flat. That is the top enclosure 125 need not have a domed shape architecture in some embodiments.

In an embodiment, the tool 100 may also include a bottom enclosure 127. The bottom enclosure 127 may cover a bottom surface of the tool 100. The bottom enclosure 127 may comprise a material that is at least substantially transparent to infrared radiation. As such, lamps on the bottom side of the tool 100 can be used to heat a bottom surface of the substrate 110. In an embodiment, the bottom enclosure 127 may be coupled to the substrate support 115. More particularly, the substrate support 115 may pass through the bottom enclosure 127. The bottom enclosure 127 is coupled to the substrate support 115 in a configuration that allows for the substrate support 115 to freely rotate.

In an embodiment, a plurality of lamps 130 may be provided outside the internal volume of the tool 100. The internal volume of the tool may refer to the volume defined by the top enclosure 125, the chamber body 120, and the bottom enclosure 127. That is, the lamps 130 are not provided within the internal volume of the tool 100 where the substrate processing is implemented. In the illustrated embodiment, three lamps 130A-130C are provided over a top surface of the top enclosure 125. Each of the three lamps 130A-130C represent different lamp regions. That is, while a single lamp is shown for each region, it is to be appreciated that a plurality of lamps 130 may be included in each region.

In an embodiment the first lamp 130A may be focused on an outer region of the substrate 110. The second lamp 130B may be focused on a middle region of the substrate 110, and the third lamp 130C may be focused on a central region of the substrate 110. In the illustrated embodiment, the lines from the lamps 130 to the substrate 110 illustrate perfect focusing of the infrared light to a particular region of the substrate. However, it is to be appreciated that infrared light from the lamps 130 may overlap each other to some degree, as will be described in greater detail below.

In the illustrated embodiment, the lamps 130 are shown focusing the infrared radiation on their own. That is, the lamp module structure is omitted for simplicity. It is to be appreciated that a lamp module structure may surround each of the lamps 130. Lamp module structures will be described in greater detail below.

In the illustrated embodiment, three front-side lamp zones are shown. However, it is to be appreciated that more than three lamp zones may be included in other embodiments. For example, the lamp module structure may include four or more zones in order to provide even more enhanced control of the temperature across the surface of the substrate 110.

In addition to front side infrared exposure, embodiments may also include backside heating. For example fourth lamp 130D and fifth lamp 130E may be provided below the bottom enclosure 127. In the case of two backside lamps 130, the fourth lamp 130D may be focused on an outer region of the substrate 110, and the fifth lamp 130E may be focused on a center region of the substrate 110. Similar to the front-side lamps 130A-130C, the lamp module structure for the backside lamps 130D and 130E is omitted for simplicity.

In an embodiment, the irradiation pattern of the front-side lamps 130A-130C may overlap the irradiation pattern of the backside lamps 130D and 130E. In other embodiments, the backside lamps 130D and 130E may be focused to overlap the interfaces between the regions on the substrate. For example, backside lamp 130D may be focused at the interface between the outer region of the substrate 110 and the middle region of the substrate 110, and backside lamp 130E may be focused at the interface between the middle region of the substrate 110 and the center region of the substrate 110.

Figure 1B:
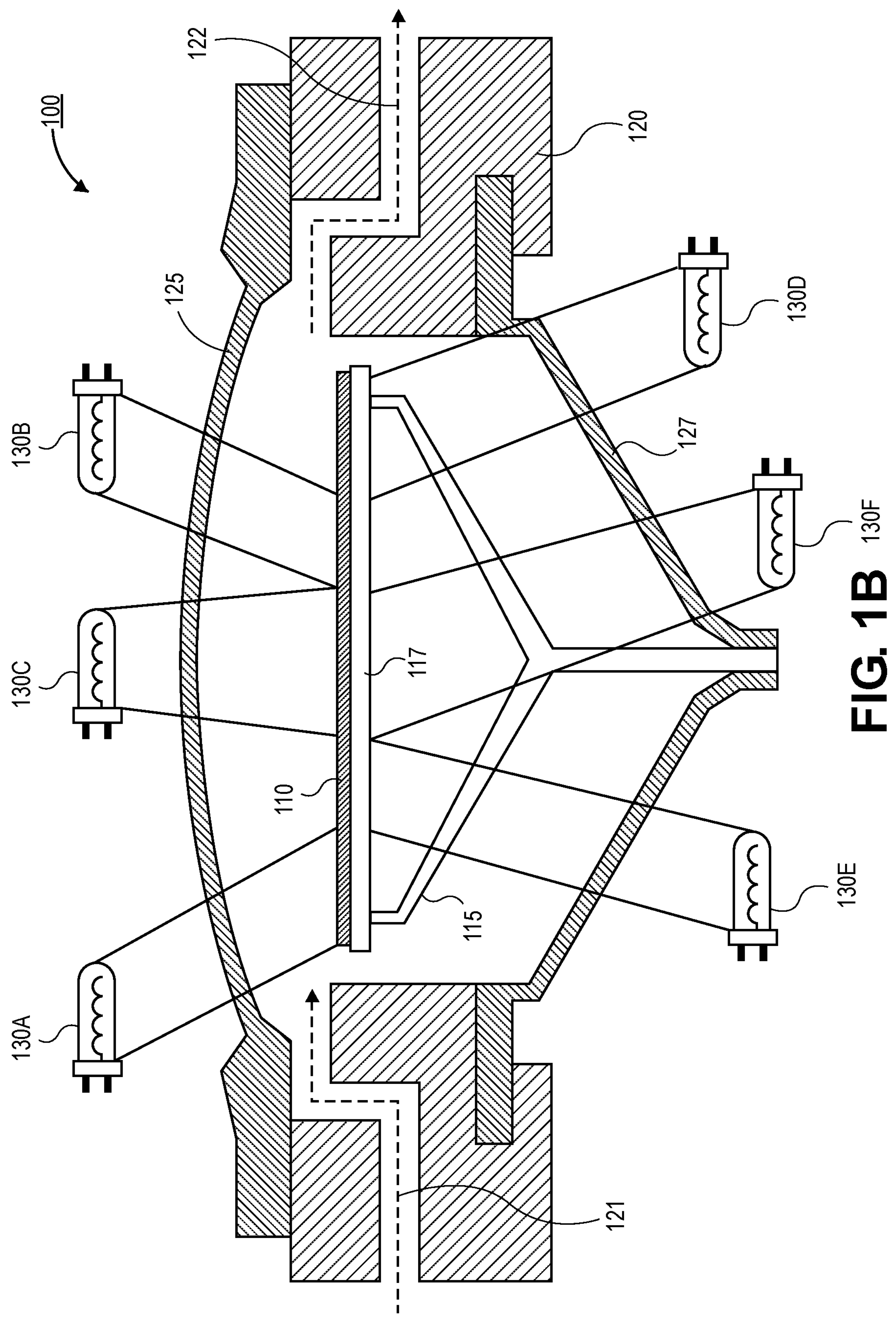
FIG. 1B is a cross-sectional illustration of a semiconductor processing tool with three top zones and three bottom zones, in accordance with an embodiment.

Referring now to FIG. 1B, a cross-sectional illustration of a tool 100 is shown, in accordance with an additional embodiment. In an embodiment, the tool 100 in FIG. 1B may be substantially similar to tool 100 in the embodiment shown in FIG. 1A, with the exception of the backside lamps 130. Instead of having a set of two lamp zones (i.e., a center region on the substrate 110 and an outer region on the substrate 110). The backside lamps 130 may include three or more zones. For example, a first lamp 130D may be focused on an outer region of the substrate 110, a second lamp 130E may be focused on a middle region of the substrate 110, and a third lamp 130F may be focused on a center region of the substrate 110. In the illustrated embodiment, the focus of the backside lamps 130 substantially overlap the focus of the front-side lamps 130. In other embodiments, the backside lamps 130 may be focused on the interface between regions on the top side of the substrate 110.

Figure 2:
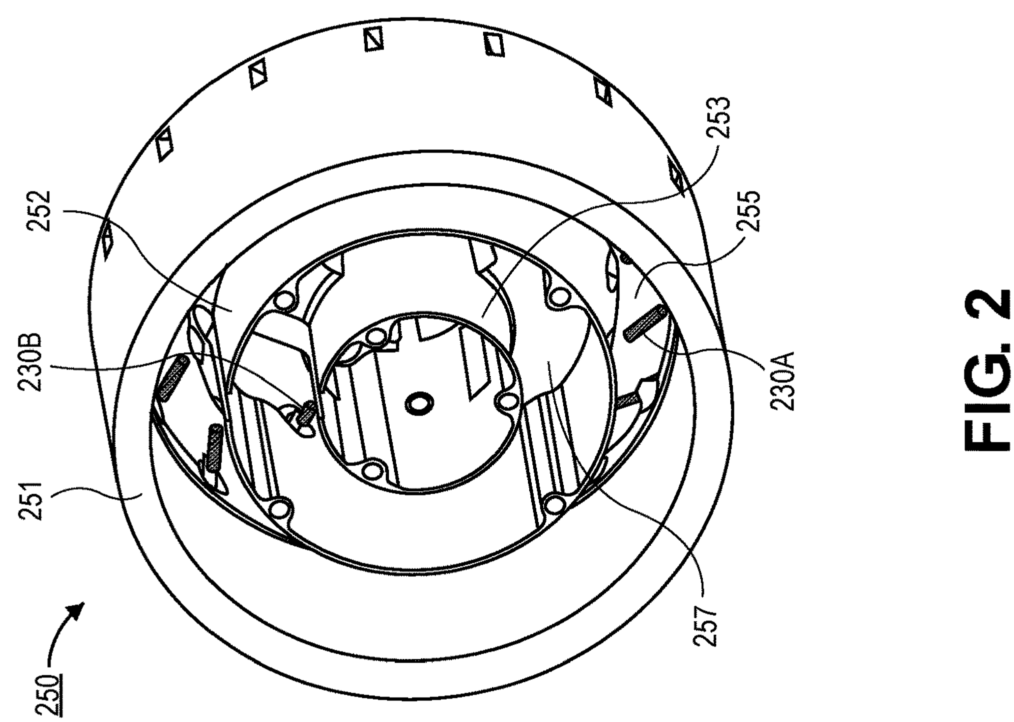
FIG. 2 is a perspective view illustration of a lamp module that includes three lamp zones, in accordance with an embodiment.

Referring now to FIG. 2, a perspective view illustration of a lamp module 250 is shown, in accordance with an embodiment. In an embodiment, the lamp module 250 may be used to focus light from a plurality of lamps onto different regions of the substrate (not shown in FIG. 2). That is, the lamp module 250 may comprise a reflector and one or more lamps. The lamp module may generally refer to the combination of reflector elements and lamp elements. For example, the lamp module may include one or more reflector zones and one or more lamps that are provided within the one or more reflector zones. As used herein, the reflector zones may be provided between rings of the reflector, as will be described in greater detail below. The lamp module 250 may be used on the front-side of the tool 100 or the backside of the tool 100. That is, light from the lamp module 250 may pass through a top enclosure 125 or a bottom enclosure 127, similar to the embodiments shown in greater detail above.

In an embodiment, the lamp module 250 may comprise a back plate 255. A plurality of rings may extend up from the back plate 255. The combination of the contour of the back plate 255 and the shape of the rings may be used to focus infrared light at a particular location on the substrate 110. In an embodiment, the lamp module 250 may comprise a material that has a high reflectivity of infrared radiation. For example, a reflectivity of the lamp module 250 may be approximately 90% or greater, approximately 95% or greater, or approximately 98% or greater. In an embodiment, the lamp module 250 may comprise a thin plated layer that has high infrared reflectivity. For example, a gold plated film may be provided over the surfaces of the lamp module 250.

In an embodiment, a first ring 251 may extend up from the back plate 255. The first ring 251 may have an outer diameter that is substantially equal to a diameter of the back plate 255. A second ring 252 may be provided within an inner diameter of the first ring 251. As shown, a thickness of the second ring 252 may be smaller than a thickness of the first ring 251. However, in other embodiments, the thickness of the first ring 251 may be substantially equal to a thickness of the second ring 252.

In an embodiment, the first lamp zone is provided between the first ring 251 and the second ring 252. For example, a plurality of first lamps 230A may be provided between the first ring 251 and the second ring 252. The first lamps 230A may be provided over the underlying back plate 255. In some embodiments, the region of the back plate 255 between the first ring 251 and the second ring 252 may be contoured in order to focus the infrared radiation to a desired location on the substrate 110 (not shown in FIG. 2). In an embodiment, there may be ten or more first lamps 230A between the first ring 251 and the second ring 252. In a particular embodiment, sixteen first lamps 230A may be provided between the first ring 251 and the second ring 252.

In an embodiment, a third ring 253 may be provided within an inner diameter of the second ring 252. The third ring 253 may have a thickness that is substantially equal to a thickness of the second ring 252. In other embodiments, the third ring 253 may have a thickness that is different than the second ring 252. In an embodiment, heights of the first ring 251, the second ring 252, and the third ring 253 may be substantially uniform. In other embodiments, on or more of the first ring 251, the second ring 252, and the third ring 253 may have different heights.

In an embodiment, a second lamp zone may be provided between the second ring 252 and the third ring 253. For example, a plurality of second lamps 230B may be provided between the second ring 252 and the third ring 253. In some embodiments, the second lamp zone may comprise four or more second lamps 230B. In a particular embodiment, the second lamp zone may comprise eight second lamps 230B.

In an embodiment, the second lamps 230B are provided between covers 257. The covers 257 may be portions of the lamp module 250 that cover the top surfaces of the third lamps (not visible in FIG. 2). Infrared light from the third lamps may propagate laterally into the region of the lamp module 250 within the third ring 253. The third ring 253 then guides the infrared light to a central region of the underlying substrate 110 (not shown in FIG. 2). That is, in some embodiments, there may not be any lamps physically located within an inner diameter of the third ring 253.

Figure 3A:
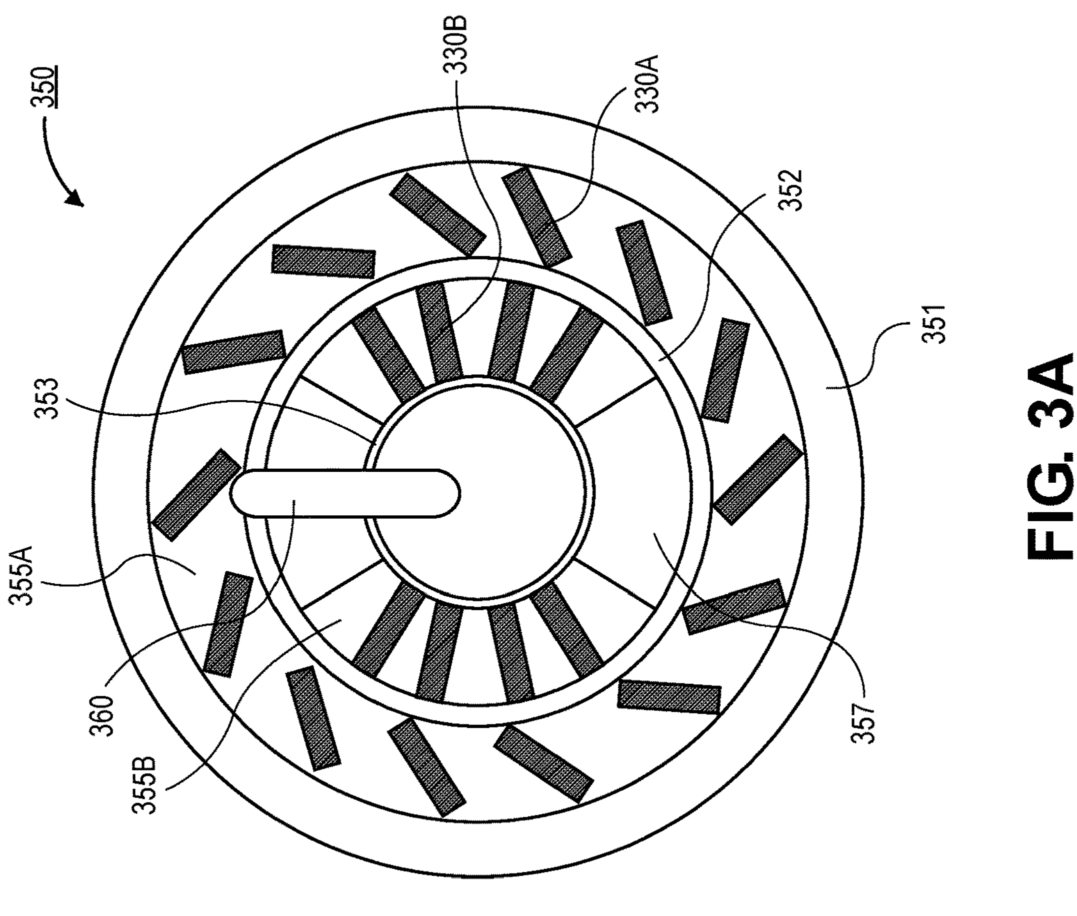
FIG. 3A is a plan view illustration of a lamp module that includes three lamp zones, in accordance with an embodiment.

Referring now to FIG. 3A, a plan view illustration of a lamp module 350 is shown, in accordance with an embodiment. In an embodiment, the lamp module 350 may have a surface that has a high reflectivity of infrared radiation. For example, the lamp module 350 may be gold plated or the like. In an embodiment, the lamp module 350 comprises a set of three rings that extend up from a circular back plate. For example, a first ring 351 is at an outer edge of the back plate 355, a second ring 352 is provided within the inner diameter of the first ring 351, and a third ring 352 is provided within the inner diameter of the second ring 352. The rings 351, 352, and 353 may be substantially similar to the rings 251, 252, and 253 described in greater detail above.

In an embodiment, a plurality of first lamps 330A may be provided over the back plate 355A between the first ring 351 and the second ring 352. The orientation of the first lamps 330A may be determined by their location around the back plate 355A. That is, the rotational orientation of each of the first lamps 330A may be different from each other. In a particular embodiment, a centerline of each of the first lamps 330A may be non-orthogonal to the first ring 351 and/or the second ring 352. In an embodiment, the back plate 355A may also be contoured in order to improve the focusing of reflected infrared radiation. For example, the back plate 355A may be curved in some embodiments. In the illustrated embodiment, a set of fourteen first lamps 330A are shown. However, it is to be appreciated that any number of first lamps 330A may be included in accordance with various embodiments.

In an embodiment, a plurality of second lamps 330B may be provided between the second ring 352 and the third ring 353. The second lamps 330B may be oriented so that a center line of each second lamp 330B is orthogonal to both the third ring 353 and the second ring 352. In an embodiment, the second lamps 330B may be provided over back plate 355B. Back plate 355B may be contoured in order to improve the reflection of the infrared radiation to an underlying substrate 110 (not shown in FIG. 3A). In an embodiment, eight second lamps 330B are shown. However, in other embodiments, fewer or more second lamps 330B may be used.

In an embodiment, the second lamps 330B may be isolated to regions of the back plate 355B that are adjacent to covers 357. For example, a pair of two covers 357 may separate the second lamps 330B on the left of the lamp module 350 from the second lamps 330B on the right of the lamp module 350. The covers 357 may cover lamps (not shown) that direct light into the center of the third ring 353, as will be described in greater detail below.

In an embodiment, a window 360 may be provided through the lamp module 350. In an embodiment, the window 360 may have a length that is greater than a width of the window 360. The elongated shape allows for a sensor (not shown) to scan linearly through the lamp module. In combination with a rotating substrate 110, the sensor can provide a spatial map of the sensed value. For example, the sensor may be a temperature sensor, such as a pyrometer. This allows for an accurate temperature of an entire substrate to be determined using the window 360. In an embodiment, the window 360 may intersect one or more of the rings 351, 352, and 353. In the illustrated embodiment, the window 360 intersects the second ring 352 and the third ring 353. In other embodiments, the first ring 351 may also be intersected, or partially intersected by the window 360.

Figure 3B:
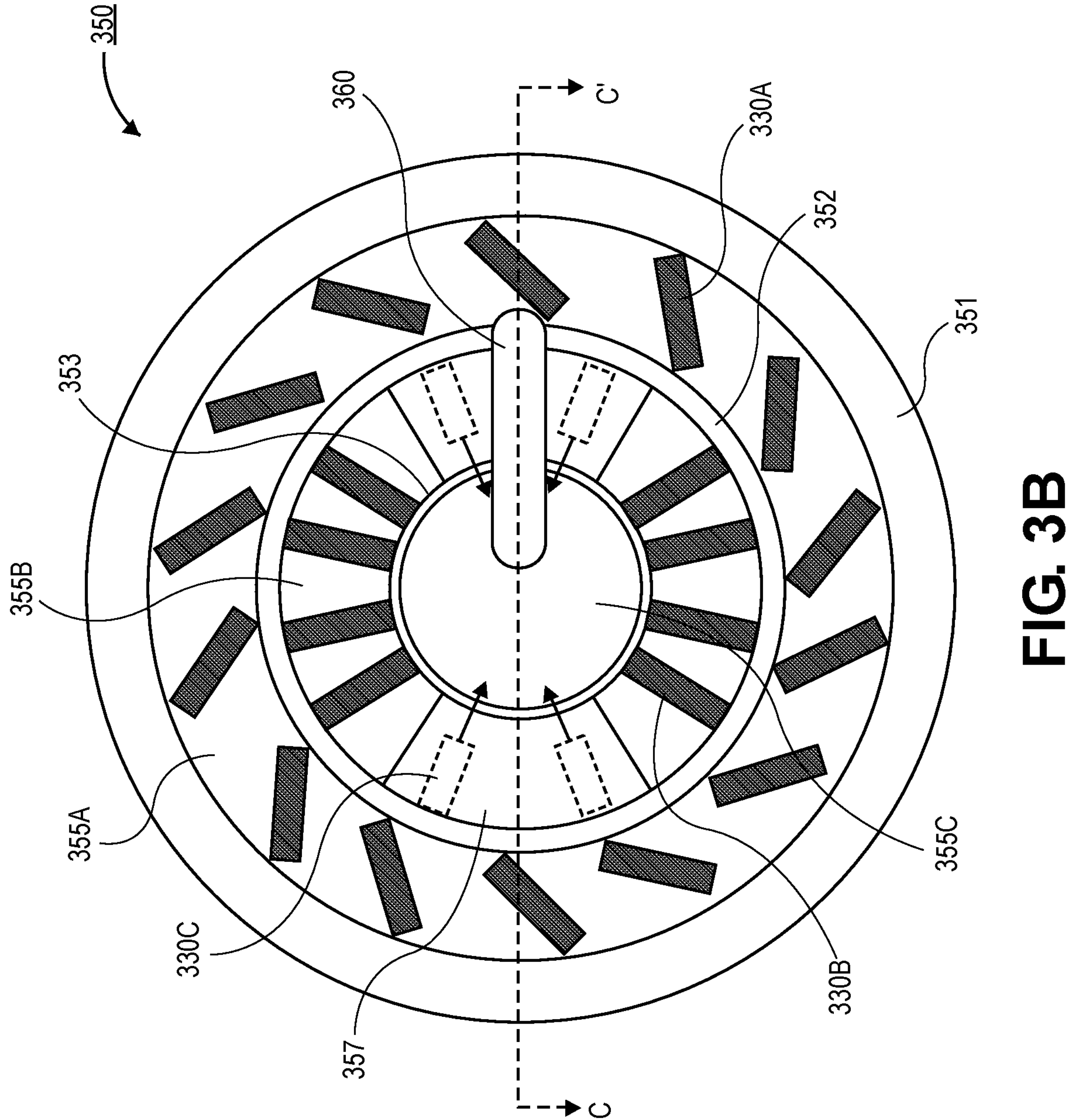
FIG. 3B is a plan view illustration of the lamp module in FIG. 3A that further illustrates the location of the lamps for the third zone of the lamp module, in accordance with an embodiment.

Referring now to FIG. 3B, a plan view illustration of a lamp module 350 is shown, in accordance with an additional embodiment. In an embodiment, the lamp module 350 in FIG. 3B may be substantially similar to the lamp module 350 in FIG. 3A with the addition of the third lamps 330C. As shown, the third lamps 330C may be positioned between the second ring 352 and the third ring 353. As indicated by the dashed lines, the third lamps 330C may be provided below the covers 357. In an embodiment, a pair of third lamps 330C are provided below each of the covers 357. Though, it is to be appreciated that any number of lamps may be provided below each of the covers 357. As shown on the right side of the lamp module 350, the window 360 may pass between a pair of third lamps 330C.

As indicated by the arrows coming out from the third lamps 330C, the infrared radiation may be guided out from under the covers 357 into the region within the third ring 353. That is, openings may be provided through the third ring 353 in order to accommodate the propagation of the infrared radiation from the third lamps 330C. In an embodiment, the back plate 355C may be contoured in order to focus the infrared radiation onto a desired region of the underlying substrate 110. In some embodiments, infrared radiation from the first lamps 330A may be focused on an outer region of the substrate 110, infrared radiation from the second lamps 330B may be focused on a middle region of the substrate 110, and infrared radiation from the third lamps 330C may be focused on a central region of the substrate 110.

Figure 3C:
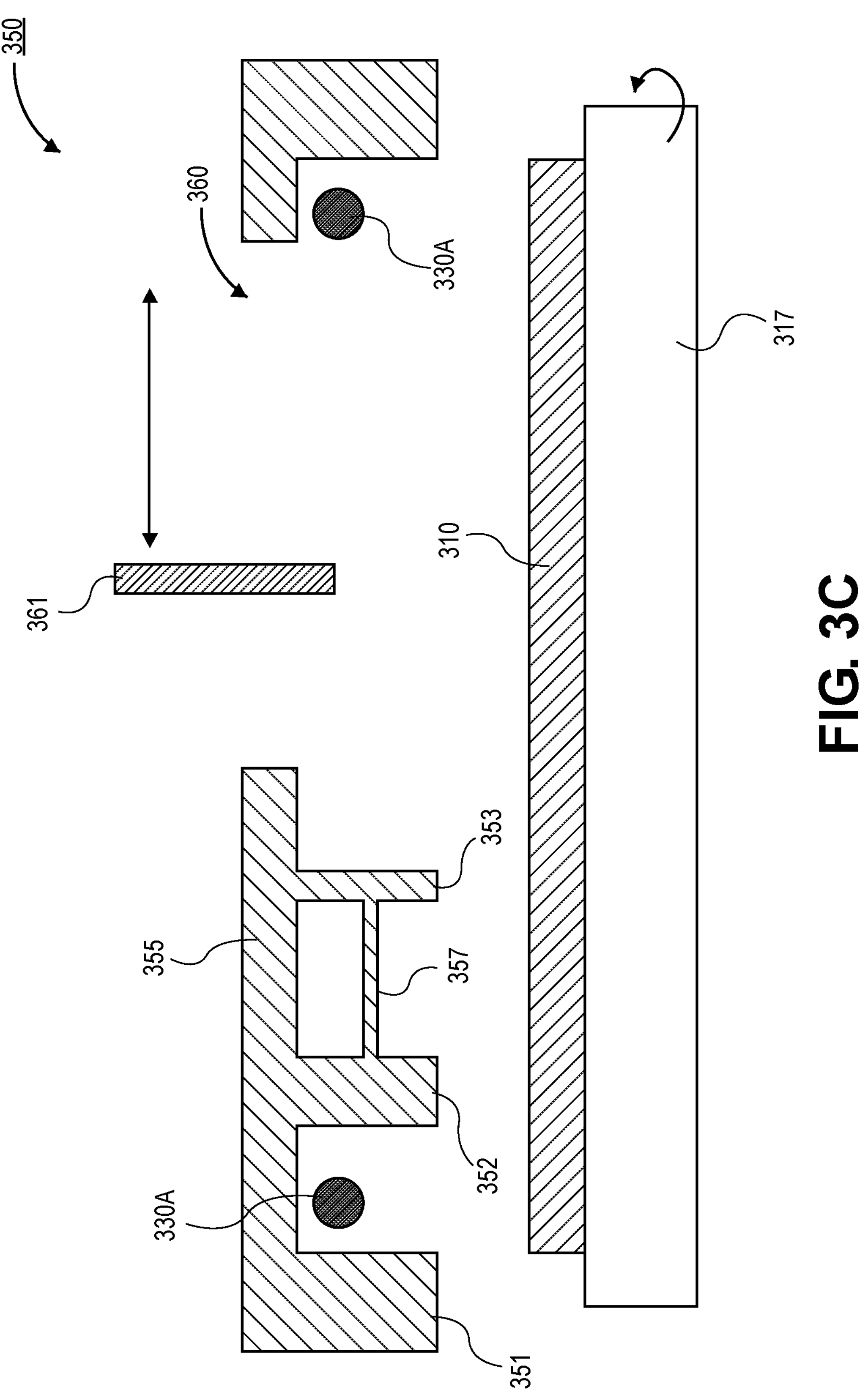
FIG. 3C is a cross-sectional illustration of the lamp module in FIG. 3B along line C-C', in accordance with an embodiment.

Referring now to FIG. 3C, a cross-sectional illustration of the lamp module 350 in FIG. 3B along line C-C' is shown, in accordance with an embodiment. In addition to the lamp module 350, a susceptor 317 and substrate 310 are shown below the lamp module 350. In an embodiment, an enclosure (not shown) may also be provided between the lamp module 350 and the substrate 310. As indicated by the curved arrow around the susceptor 317, the susceptor 317 and the substrate 310 may be rotated.

In an embodiment, the lamp module 350 may comprise a back plate 355. As shown, a plurality of rings extend up from the back plate 355. A first ring 351 is at a perimeter of the back plate 355. A second ring 352 and a third ring 353 are also provided in the lamp module 350. In the illustrated embodiment, only the left side of the second ring 352 and the third ring 353 are shown since the window 360 passes through the opposite end of the rings 352 and 353. In an embodiment, a cover 357 is provided over the back plate 355 between the second ring 352 and the third ring 353. First lamps 330A are shown in the lamp module 350. It is to be appreciated that second lamps 330B and third lamps 330C are provided out of the plane illustrated in FIG. 3C.

In an embodiment, a sensor 361 may be configured to be inserted through the window 360. The sensor 361 may be a temperature sensor, such as a pyrometer. In an embodiment, the sensor 361 is configured to scan across the rotating substrate 310, as indicated by the double sided arrow adjacent to the sensor 361. By rotating the substrate 310 and linearly scanning the sensor 361 a map of the entire surface of the substrate 310 can be provided. The temperature information from the sensor 361 may be used as a feedback signal to control the power of the first lamps 330A, the second lamps 330B, and the third lamps 330C.

In the embodiments shown in FIGS. 3A-3C, the lamp module 350 is configured to be a top-side lamp module. That is, the infrared radiation from the lamps 330 will pass through a top enclosure 125 of the tool 100. Of course, it is to be appreciated that a similar lamp module 350 may be used to expose a bottom surface of the substrate to infrared radiation. That is, the lamp module 350 may be configured to emit infrared radiation through a bottom enclosure 127 of the tool 100.

Figure 4A:
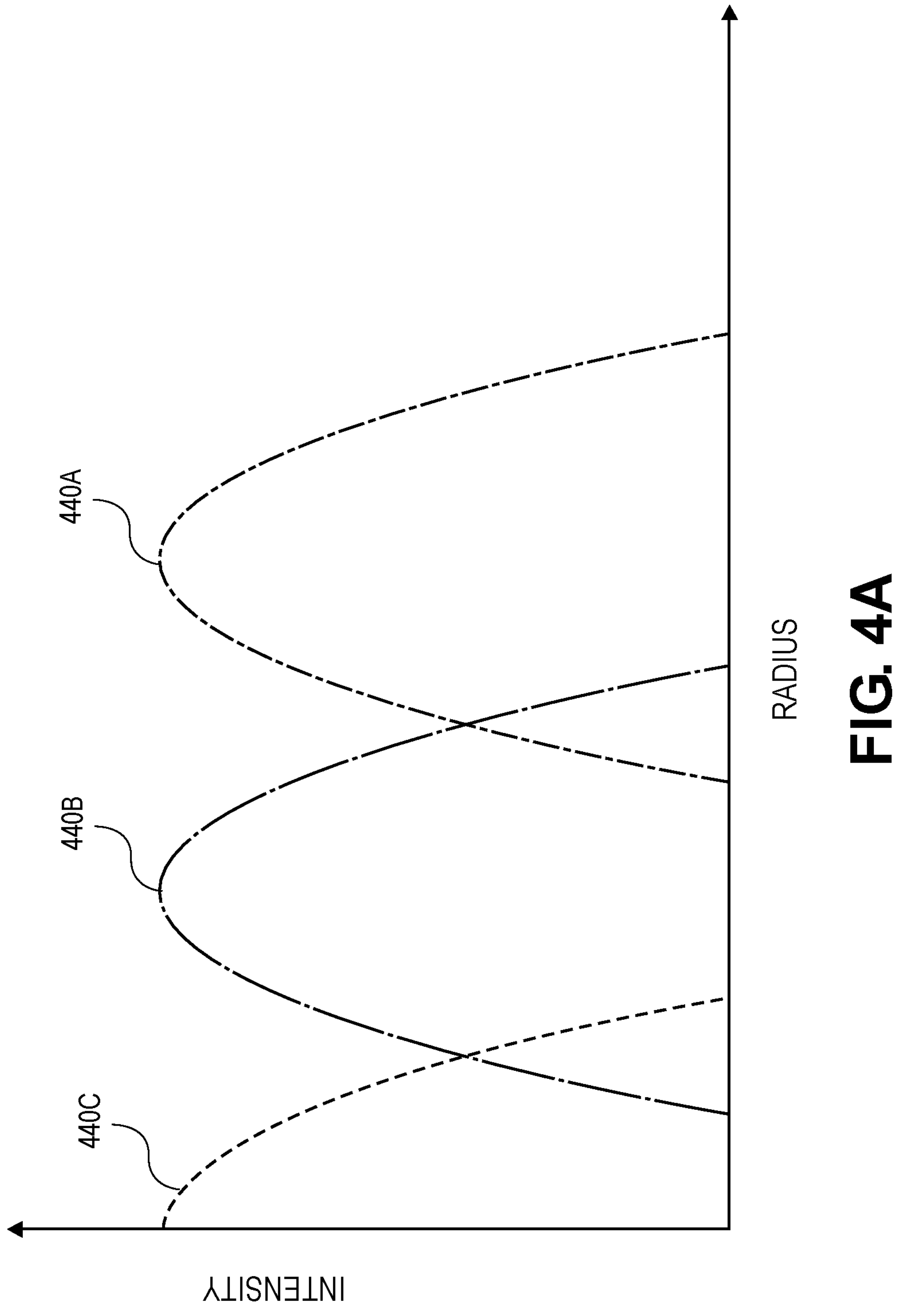
FIG. 4A is a graph of the intensity of the lamp zones across a radius of the substrate, in accordance with an embodiment.

Referring now to FIG. 4A, a graph of the intensity of the lamps across a radius of the substrate is shown, in accordance with an embodiment. As shown, there are three peaks 440A-440C. Each peak may correspond to one zone of the lamp module. For example, peak 440A may be at the outer region of the substrate, peak 440B may be at a middle region of the substrate, and peak 440C may be at a center region of the substrate. In an embodiment, the peaks 440A-440C may partially overlap each other. The overlapping nature of the peaks 440A-440C may result in a smoother temperature profile. However, it is to be appreciated that a perfectly flat profile across the radius of the substrate may not be possible with top lamp modules only.

Accordingly, embodiments disclosed herein may include bottom lamp modules that also provide infrared radiation to the substrate from the backside. In a particular embodiment, the bottom lamp module may emit infrared radiation that is complimentary to the top peaks 440A-440C. One such example of complimentary peaks is shown in FIG. 4B.

Figure 4B:
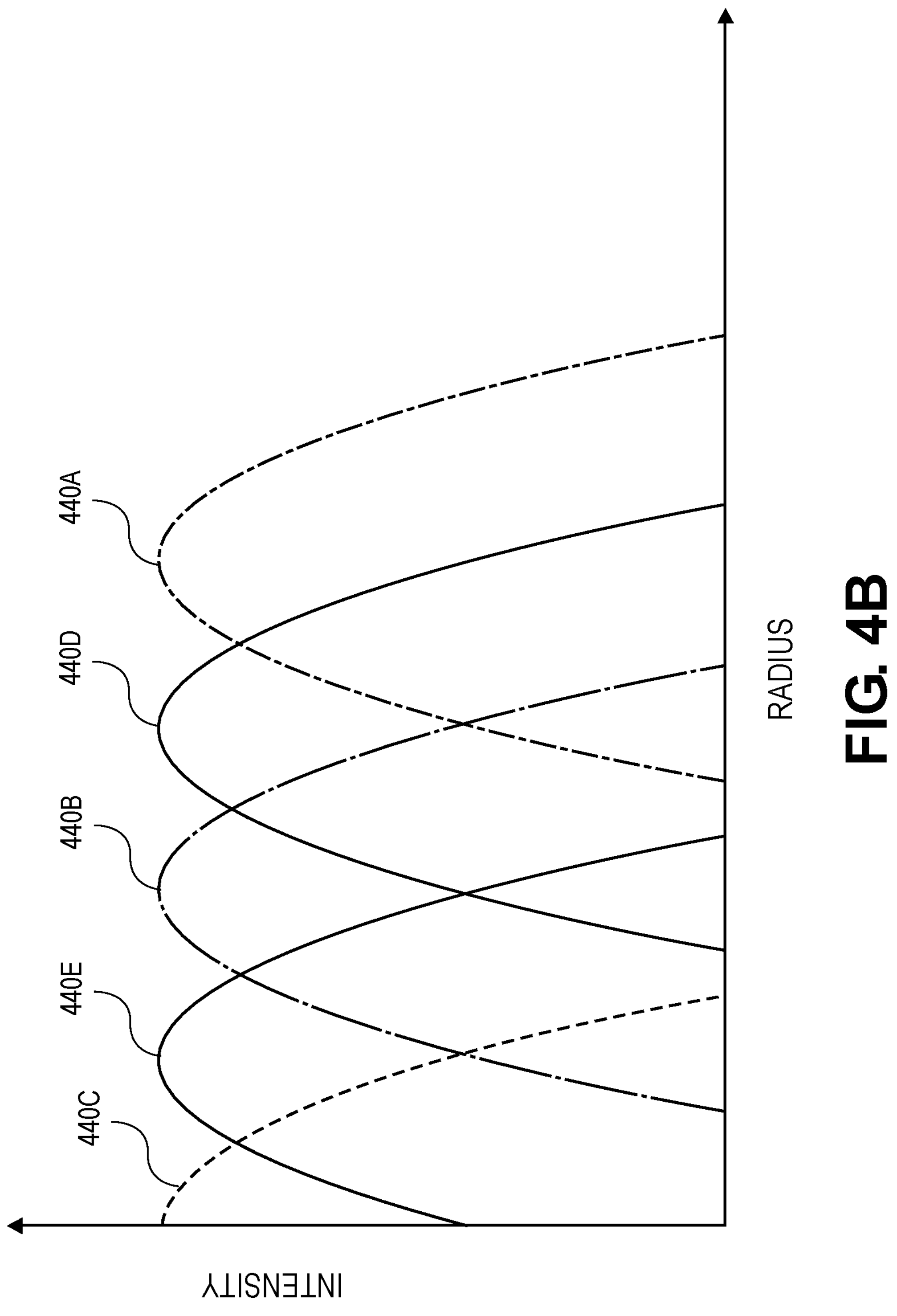
FIG. 4B is a graph of the intensity of the lamp zones for top lamps and bottom lamps across a radius of the substrate, in accordance with an embodiment.

In FIG. 4B, a fourth peak 440D and a fifth peak 440E are shown. The fourth peak 440D may be provided between the first peak 440A and the second peak 440B, and the fifth peak 440E may be provided between the second peak 440B and the third peak 440C. As such, the temperature dips at the interface between regions can be accommodated for by backside illumination.

Figure 4C:
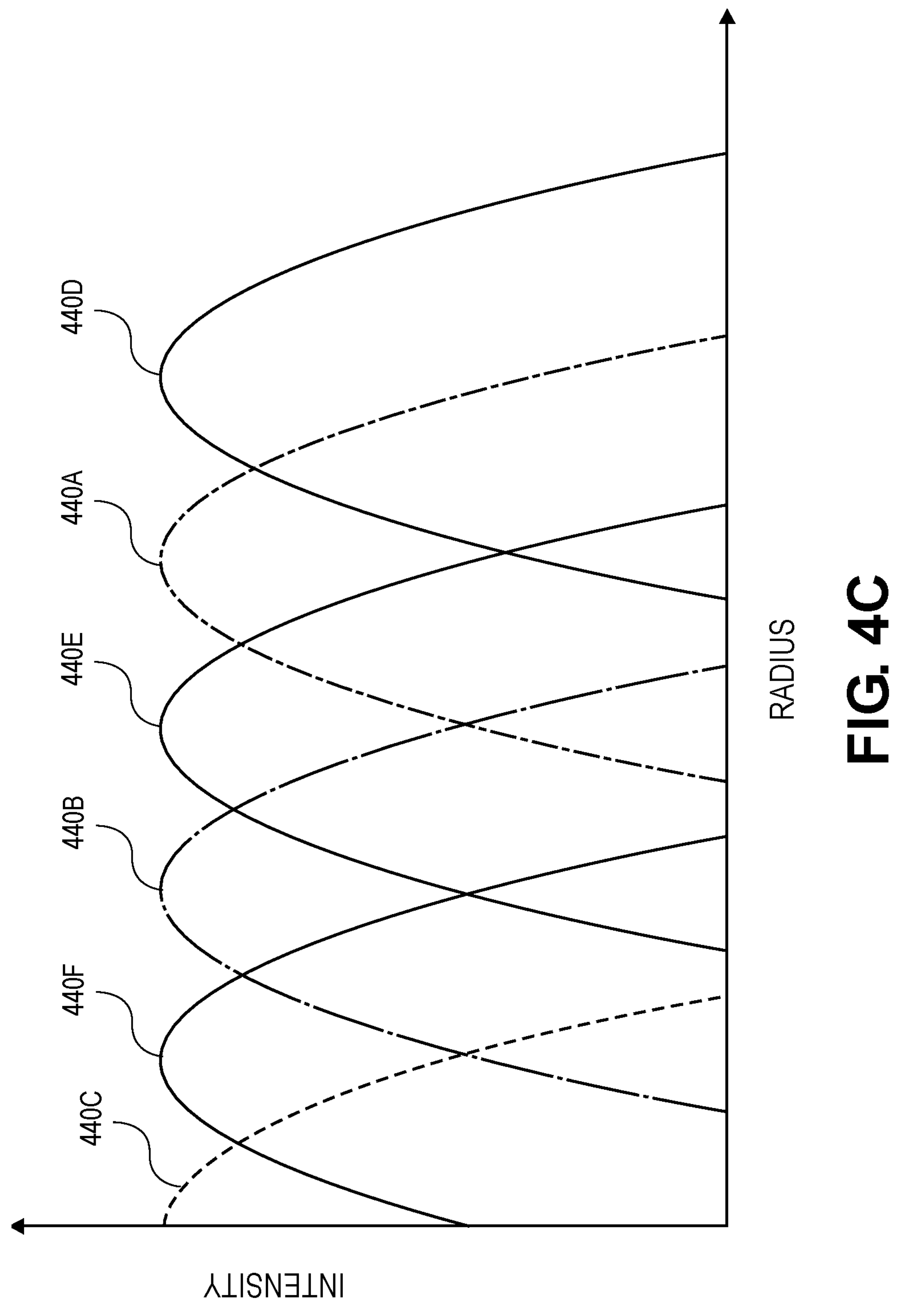
FIG. 4C is a graph of the intensity of the lamp zones for three top lamp zones and three bottom lamp zones, in accordance with an embodiment.
Figure 5:
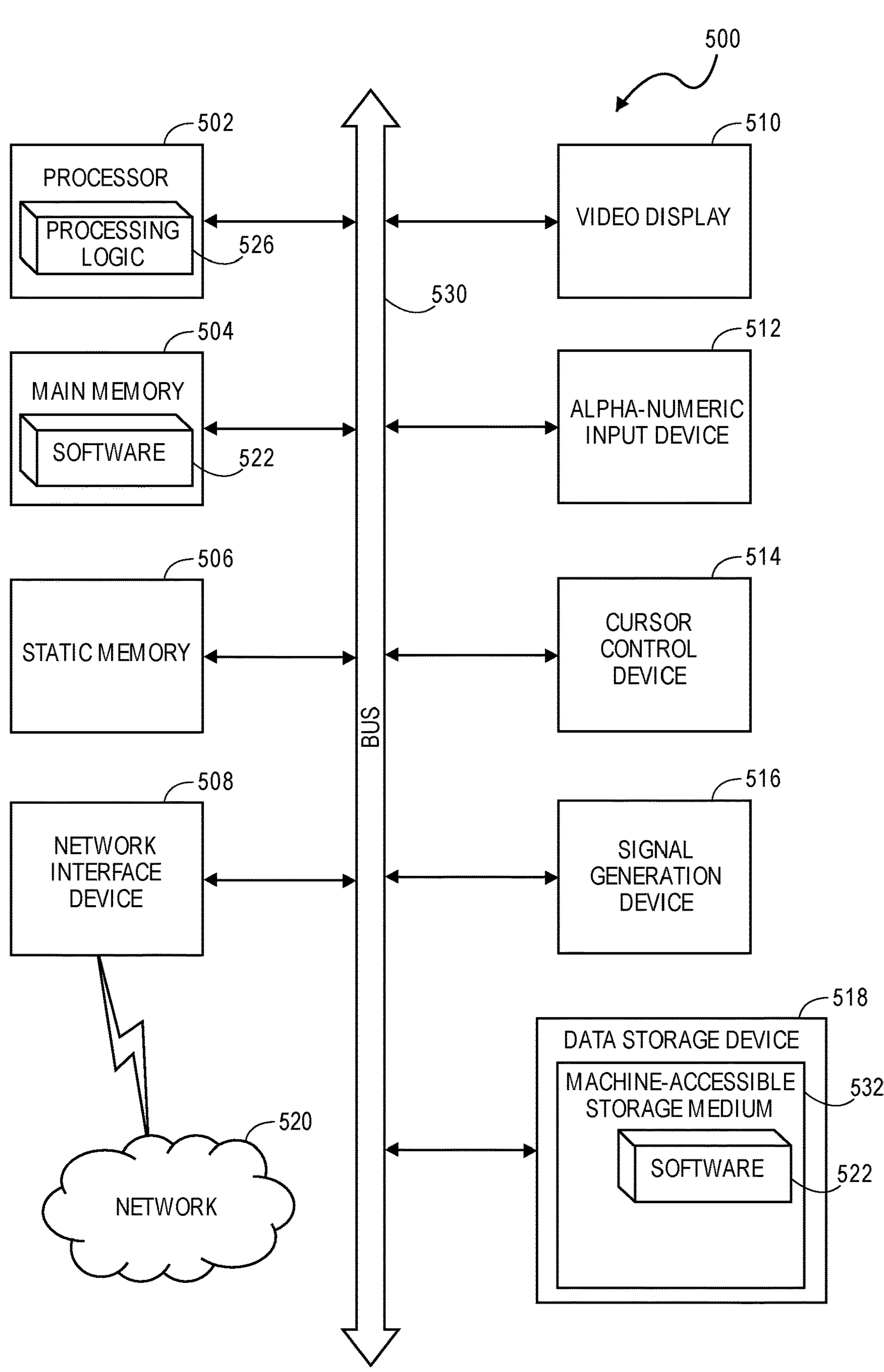
FIG. 5 illustrates a block diagram of an exemplary computer system that may be used in conjunction with a processing tool, in accordance with an embodiment.

In FIG. 4C, a similar graph of intensity across the radius of the substrate is shown, in accordance with an additional embodiment. Instead of having a backside lamp module with two zones, three zones are provided in the backside lamp module. In such an embodiment, the fourth peak 440D may be outside the first peak 440A, the fifth peak 440E may be between the first peak 440A and the second peak 440B, and the sixth peak 440F may be between the second peak 440B and the third peak 440C.

Computer system 500 may include a computer program product, or software 522, having a non-transitory machine-readable medium having stored thereon instructions, which may be used to program computer system 500 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 500 includes a system processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

System processor 502 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 502 may also be one or more special-purpose processing devices such as an application specific integrated circuit (ASIC), a field programmable gate array (FPGA), a digital signal system processor (DSP), network system processor, or the like. System processor 502 is configured to execute the processing logic 526 for performing the operations described herein.

The computer system 500 may further include a system network interface device 508 for communicating with other devices or machines. The computer system 500 may also include a video display unit 510 (e.g., a liquid crystal display (LCD), a light emitting diode display (LED), or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium 532 (or more specifically a computer-readable storage medium) on which is stored one or more sets of instructions (e.g., software 522) embodying any one or more of the methodologies or functions described herein. The software 522 may also reside, completely or at least partially, within the main memory 504 and/or within the system processor 502 during execution thereof by the computer system 500, the main memory 504 and the system processor 502 also constituting machine-readable storage media. The software 522 may further be transmitted or received over a network 520 via the system network interface device 508. In an embodiment, the network interface device 508 may operate using RF coupling, optical coupling, acoustic coupling, or inductive coupling.

While the machine-accessible storage medium 532 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A lamp module for a semiconductor processing chamber, comprising:
   - a back plate;
   - a first ring that extends from the back plate;
   - a second ring that extends from the back plate;
   - a third ring that extends from the back plate;
   - a first plurality of lamps between the first ring and the second ring, each lamp of the first plurality of lamps having a length greater than a width in a plan view, and each lamp of the first plurality of lamps having a centerline along the length that is non-orthogonal to the first ring and the second ring;
   - a second plurality of lamps between the second ring and the third ring, each lamp of the second plurality of lamps having a length greater than a width in the plan view, and each lamp of the second plurality of lamps having a centerline along the length that is orthogonal to the second ring and the third ring;
   - a third plurality of lamps configured to emit infrared radiation that propagates into the third ring; and
   - a window through the back plate, the window intersecting with and extending through each of the second ring and the third ring.

2. The lamp module of claim 1, wherein the first plurality of lamps are oriented to irradiate an outer region of a substrate positioned below the lamp module.

3. The lamp module of claim 1, wherein the second plurality of lamps are oriented to irradiate a middle region of a substrate positioned below the lamp module.

4. The lamp module of claim 1, wherein the third plurality of lamps are oriented to irradiate a center region of a substrate positioned below the lamp module.

5. The lamp module of claim 1, wherein the lamp module is configured for use with a chemical vapor deposition (CVD) chamber.

6. The lamp module of claim 1, wherein the first plurality of lamps, the second plurality of lamps, and the third plurality of lamps are provided on the back plate.

7. The lamp module of claim 6, wherein the back plate is configured to reflect light from the first plurality of lamps, the second plurality of lamps, and the third plurality of lamps away from the lamp module.

8. The lamp module of claim 1, wherein a pyrometer is positioned in the window, and wherein the pyrometer is configured to scan laterally through the window.

9. A semiconductor processing tool, comprising:

a pedestal with a first surface and a second surface for supporting a substrate;

a first enclosure facing the first surface of the pedestal;

a second enclosure facing the second surface of the pedestal;

a first lamp module outside the first enclosure and the second enclosure, wherein the first lamp module comprises three or more heating zones; and a second lamp module outside the first enclosure and the second enclosure on an opposite side from the first lamp module, wherein the second lamp module comprises a plurality of heating zones, wherein the second lamp module or the first lamp module comprises:

a back plate;

a first ring that extends from the back plate;

a second ring that extends from the back plate;

a third ring that extends from the back plate;

a first plurality of lamps between the first ring and the second ring, each lamp of the first plurality of lamps having a length greater than a width in a plan view, and each lamp of the first plurality of lamps having a centerline along the length that is non-orthogonal to the first ring and the second ring;

a second plurality of lamps between the second ring and the third ring, each lamp of the second plurality of lamps having a length greater than a width in the plan view, and each lamp of the second plurality of lamps having a centerline along the length that is orthogonal to the second ring and the third ring;

a third plurality of lamps configured to emit infrared radiation that propagates into the third ring; and a window through the back plate, the window intersecting with and extending through each of the second ring and the third ring.

10. The semiconductor processing tool of claim 9, wherein the heating zones of the first lamp module comprises:

a first zone for heating an outer region of the substrate placed on the pedestal;

a second zone for heating a middle region of the substrate placed on the pedestal; and a third zone for heating a center region of the substrate placed on the pedestal.

11. The semiconductor processing tool of claim 10, wherein the plurality of heating zones on the second lamp module are oriented to heat a backside of the substrate placed on the pedestal.

12. The semiconductor processing tool of claim 11, wherein the plurality of heating zones on the second lamp module comprises:

a fourth heating zone configured to heat the substrate at an interface between the first zone and the second zone; and a fifth heating zone configured to heat the substrate at an interface between the second zone and the third zone.

13. The semiconductor processing tool of claim 9, wherein the first enclosure and the second enclosure comprise quartz.

14. The semiconductor processing tool of claim 9, wherein the pedestal is configured to rotate.

15. The semiconductor processing tool of claim 9, wherein the semiconductor processing tool is a chemical vapor deposition (CVD) processing tool.

16. A lamp module for a semiconductor processing chamber, comprising:

a back plate;

a plurality of lamp zones separated from each other by rings that extend from the back plate;

a plurality of lamps positioned within each of the plurality of lamp zones, wherein a first plurality of lamps are oriented to irradiate an outer zone of a substrate positioned below the lamp module, wherein a second plurality of lamps are oriented to irradiate a middle zone of the substrate positioned below the lamp module, wherein a third plurality of lamps are oriented to irradiate a center zone of the substrate positioned below the lamp module, each lamp of the first plurality of lamps having a length greater than a width in a plan view, and each lamp of the first plurality of lamps having a centerline along the length that is non-orthogonal to the first ring and the second ring, each lamp of the second plurality of lamps having a length greater than a width in the plan view, and each lamp of the second plurality of lamps having a centerline along the length that is orthogonal to the second ring and the third ring; and a window through the back plate, the window intersecting with and extending through each of two or more of the rings.

17. The lamp module of claim 16, wherein the lamp module is configured for use with a chemical vapor deposition (CVD) processing tool.

* * * * *